United States Patent
Koelsch et al.

(10) Patent No.: US 6,320,405 B1
(45) Date of Patent: Nov. 20, 2001

(54) CIRCUIT FOR THE SWITCHING OF LOADS

(75) Inventors: Volker Koelsch, Stuttgart; Rainer Topp, Reutlingen, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/485,838

(22) PCT Filed: Mar. 17, 1998

(86) PCT No.: PCT/EP98/01538
§ 371 Date: May 9, 2000
§ 102(e) Date: May 9, 2000

(87) PCT Pub. No.: WO99/09652
PCT Pub. Date: Feb. 25, 1999

(30) Foreign Application Priority Data

Aug. 16, 1997 (DE) ............................... 197 35 543

(51) Int. Cl.[7] .................................. H03K 19/003
(52) U.S. Cl. ........................ 326/10; 326/9; 326/12; 326/13
(58) Field of Search ............... 326/9, 10, 11, 326/12, 13, 14, 83, 86, 121

(56) References Cited

U.S. PATENT DOCUMENTS

| | | | |
|---|---|---|---|
| 5,216,293 | * | 6/1993 | Sei et al. ............................... 307/443 |
| 5,367,205 | * | 11/1994 | Powell .................................. 326/27 |
| 5,598,119 | * | 1/1997 | Thayer et al. ........................ 327/111 |

FOREIGN PATENT DOCUMENTS

| | | |
|---|---|---|
| 39 24 988 A | 1/1991 | (DE) . |
| 43 21 971 A | 1/1994 | (DE) . |
| 0 609 158 A | 8/1994 | (EP) . |
| 0 717 497 A | 6/1996 | (EP) . |

* cited by examiner

Primary Examiner—Michael Tokar
Assistant Examiner—Vibol Tan
(74) Attorney, Agent, or Firm—Kenyon & Kenyon

(57) ABSTRACT

An apparatus for switching loads, based on a starting signal, having a first MOSFET output stage and a second downstream MOSFET output stage, each of the MOSFET output stages being controllable by a logic circuit, with a power supply voltage of the downstream MOSFET output stage being supplied over the first MOSFET output stage. The apparatus includes a line that is adapted to connect each logic circuit of the MOSFET output stages and to provide an input voltage to a logic circuit of the downstream MOSFET output stage. The apparatus also includes a monitoring arrangement, which is activated by the starting signal, that is adapted to monitor the power supply voltage of the downstream MOSFET output stage and prevent activation of the first MOSFET output stage when the power supply voltage is below a predetermined value. Also included in this apparatus is a varying arrangement that is adapted to vary the input voltage when the first MOSFET output stage is activated based on the starting signal, and an activating arrangement that is adapted to activate the downstream MOSFET output stage. The activating arrangement includes a controlling arrangement, which is connected to the line and to another line connecting the MOSFET output stages, that is adapted to control activation of the downstream MOSFET output stage and prevent activation when the power supply voltage exceeds a threshold potential and the starting signal is not detected.

10 Claims, 4 Drawing Sheets

CIRCUIT FOR THE SWITCHING OF LOADS

FIELD OF THE INVENTION

The present invention relates to a circuit configuration for switching loads.

BACKGROUND OF THE INVENTION

In switching safety-relevant loads in the automotive field, for example, critical operating states due to a defect in the switch must absolutely be avoided. Therefore, in most cases circuit configurations having two independent series-connected semiconductor switches are used for switching such loads to create a certain redundancy. With this concept, one of the switches is used to switch the load while the other functions as an "emergency stop switch." This "emergency stop switch" monitors the functionality of the switch that switches the load. No monitoring of the functionality of the "emergency stop switch" is provided here.

SUMMARY OF THE INVENTION

According to one aspect of an exemplary embodiment of the present invention, a circuit configuration having at least two series-connected MOSFET output stages, each can be controlled by a logic circuit, is proposed, with mutual monitoring of the two MOSFET output stages being implemented so that starting of the load is prevented in the event of a short circuit in one of the two MOSFET output stages.

According to one aspect of an exemplary embodiment of the present invention, the power supply voltage of the downstream MOSFET output stage is supplied over the first MOSFET output stage, so that a short circuit in the downstream MOSFET output stage can be detected simply by monitoring its power supply voltage when small test currents are supplied. Therefore, according to the present invention, means are provided that are activated by a starting signal (INPUT), and prevent activation of the first MOSFET output stage when the power supply voltage of the downstream MOSFET output stage is below a predetermined value.

To determine whether there is a short circuit in the first MOSFET output stage, in an exemplary embodiment of the present invention, a circuit configuration includes a connection line between the logic circuits of the two MOSFET output stages, with an input voltage being applied to the logic circuit of the downstream MOSFET output stage over this connecting line. Then when the first MOSFET output stage is activated on the basis of the INPUT signal, this input voltage is varied in a defined manner. In the case of a short circuit in the first MOSFET output stage, there is a sufficient power supply voltage for the downstream MOSFET output stage, but the input voltage applied to the system logic of the downstream MOSFET output stage differs from the input voltage defining the normal state. The fault case can thus be detected easily, and activation of the downstream MOSFET output stage and thus of the load can be prevented.

According to one aspect of an exemplary embodiment of the present invention a circuit configuration permits parallel monitoring of the functionality of both MOSFET output stages. The load is prevented from starting when there is a defect in one of the two MOSFET output stages, so critical operating states of the downstream load can be prevented reliably.

In an advantageous embodiment of the circuit configuration In an exemplary embodiment of the present invention, in addition to taking into case of simultaneous damage to the respective system logic is also taken into account and starting of the load is also prevented in this case. The circuit configuration according to in exemplary embodiment of the present invention or the system logic of the first MOSFET output stage has means for clocking the input voltage. With the help of the system logic of the downstream MOSFET output stage, the switching edges in the input voltage signal are detected and the load is switched off in the absence of switching edges. Thus, the functionality of the system logic of the first MOSFET output stage is also tested by analyzing the clock pulse of the input signal.

In terms of circuit logic, there are now various options for implementing the individual functions described above for the circuit configuration according to the present invention for switching loads. Especially advantageous embodiments of the present invention are illustrated in the drawings and explained in greater detail in the following description. The drawings show:

DETAILED DESCRIPTION

Figure 1:
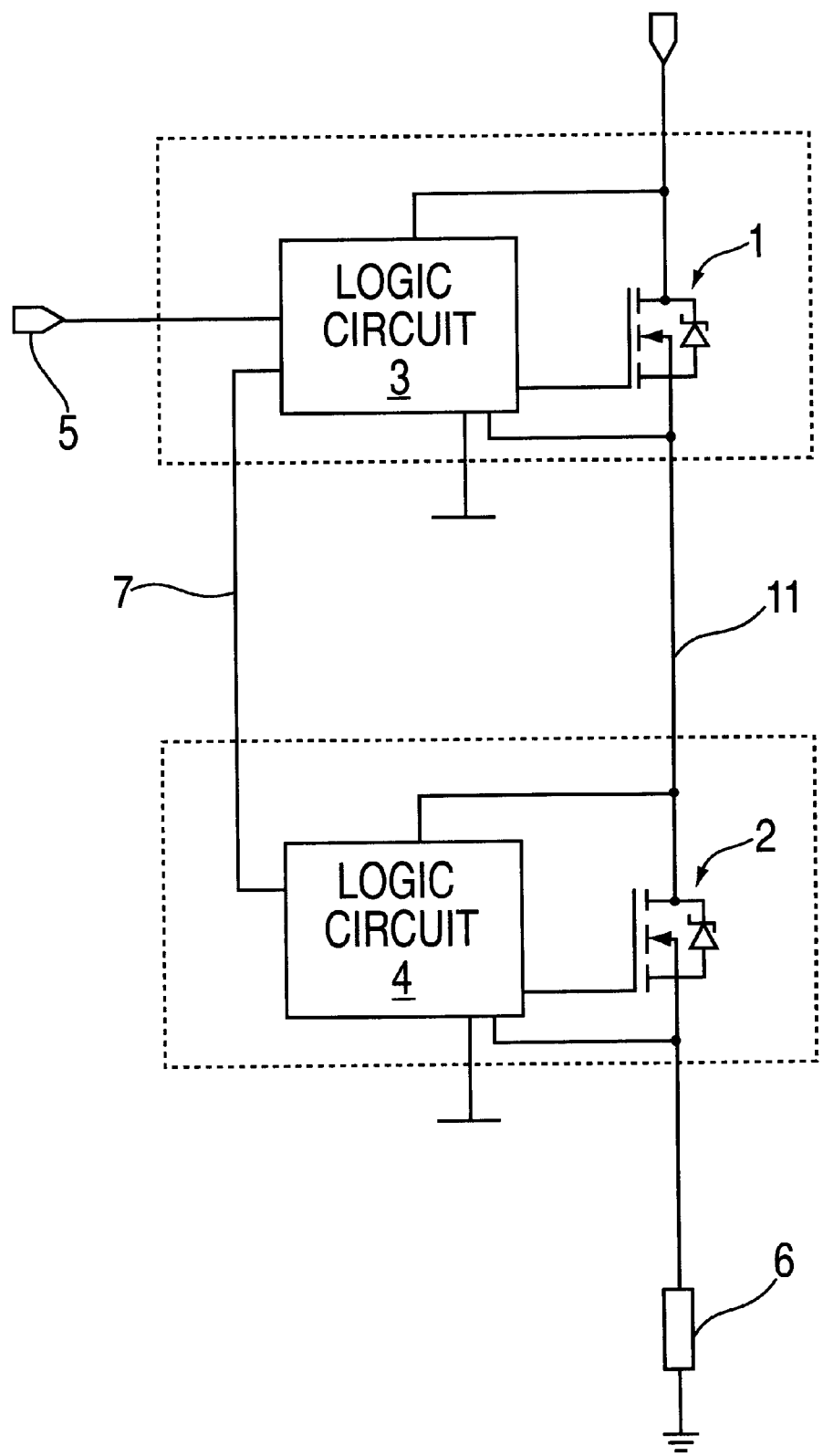
FIG. 1 a block diagram of a circuit configuration according to the present invention, FIG. 2 an embodiment of the circuit part used to monitor the first MOSFET output stage, FIG. 3 an embodiment of the circuit part used to monitor the second MOSFET output stage, FIG. 4 an expansion of the circuit part shown in FIG. 2 for monitoring the functionality of the system logic of the first MOSFET output stage, and FIG. 5 a corresponding expansion of the circuit part illustrated in FIG. 3.

FIG. 1 shows the block diagram of a circuit configuration according to the present invention for switching loads. The circuit configuration includes two series-connected MOSFET output stages 1 and 2, each can be controlled by a logic circuit 3 and 4. A starting signal (INPUT) 5 triggering the starting/stopping of MOSFET output stages 1 and 2 and thus also triggering downstream load 6 is sent to first MOSFET output stage 1. The power supply voltage of downstream MOSFET output stage 2 is supplied over first MOSFET output stage 1, and only when first MOSFET output stage 1 is turned on.

In addition, a connecting line 7 is provided according to an exemplary embodiment of the present invention between logic circuits 3 and 4, with an input voltage (EN) being applied to logic circuit 4 of downstream MOSFET output stage 2 over this connecting line.

In conjunction with FIG. 2, which depicts part of circuit 3, the monitoring of downstream MOSFET output stage 2 is explained below.

First only a transistor 8 connected in parallel to MOSFET output stage 1 is switched on by INPUT signal 5 and supplies a defined current. First MOSFET output stage 1 remains off at first, just like downstream MOSFET output stage 2. As long as first MOSFET output stage 1 is off, a flip-flop 9 is in the reset state, i.e., output QN=high. Thus, a downstream transistor 10 is blocked, and connecting line 7 to system logic 4 of downstream MOSFET output stage 2 is at the potential EN=low.

Since the current supplied by transistor 8 is greater than the zero-signal current of downstream MOSFET output stage 2 and respective system logic 4, the potential (LOAD1) of connecting line 11 between two MOSFET output stages 1 and 2 with respect to ground increases. LOAD1 is the power supply voltage of downstream MOSFET output stage 2. This increase in potential is detected with the help of a comparator 12 at whose input is applied potential LOAD1, while the other input is connected to a reference voltage (Vs) 13. If potential LOAD1 exceeds reference voltage Vs 13, flip-flop 9 is set by comparator 12, so that output Q=OK=high and MOSFET output stage 1 is activated. At the same time, transistor 10 is activated over output QN=low of flip-flop 9, so that input voltage EN=high. If MOSFET output stage 1 is turned on and input voltage EN=high, downstream MOSFET output stage 2 is also activated.

In a fault case, i.e., if a short circuit occurs in downstream MOSFET output stage 2, there is no increase in potential LOAD1 after turning on transistor 8, because it is kept at ground potential over short-circuited MOSFET output stage 2 and downstream load 6. The current supplied by transistor 8 is so low that it does not cause any mentionable voltage drop (>Vs) over load 6. Since no increase in potential LOAD1 is detected, flip-flop 9 remains in the reset state. Thus, MOSFET output stage 1 also remains off, and as a result, downstream load 6 also remains off.

A system circuit part 14 has application-specific functions and also various safety functions such as safety functions to protect against excess temperature, short circuit of a load, excess voltage, etc. System circuit part 14 also supplies the control signals for transistor 8 and MOSFET output stage 1 as well as the reset signal for flip-flop 9. In addition, system circuit part 14 analyzes the OK signal of flip-flop 9, i.e., MOSFET output stage 1 is switched on only when OK=high.

In conjunction with FIG. 3, which depicts part of circuit 4, the monitoring of MOSFET output stage 1 is explained below.

As explained above, the power supply voltage is supplied to downstream MOSFET output stage 2 and respective system logic 4 over first MOSFET output stage 1. In the normal starting procedure, i.e., when MOSFET output stage 1 is functional, power supply voltage LOAD1 is applied only at the instant when MOSFET output stage 1 together with respective system logic 3 is activated by INPUT signal 5. In this case, a transistor 15 is activated by input voltage EN=high. Thus, MOSFET output stage 2 is also activated.

In the event of a short circuit of first MOSFET output stage 1, downstream MOSFET output stage 2 together with respective system logic 4 is receiving voltage although the input voltage is at low potential. In this case, a third transistor 16 is switched on before the input voltage changes from low to high. This activates a transistor 17 which blocks second transistor 15. In this way, second transistor 15 can no longer be activated even when an input voltage EN=high, so MOSFET output stage 2 remains off.

To prevent the simultaneous response of second transistor [s] 15 and third transistor 16, the circuit configuration shown here also includes a transistor 18 which is activated together with second transistor 15, so that third transistor 16 cannot be switched on when second transistor 15 is on. To ensure the proper switching sequence of second transistor[s] 15 and third transistor 16, the circuit configuration provides for an ON delay in the form of an RC timing element for third transistor 16. In addition, transistor 17 is only ever activated when third transistor 16 is on, and then it blocks second transistor 15. In this connection, it is important that the ON delay of third transistor 16 is so great that second transistor [s] 15 and transistor 18 must always be switched on first in a fault-free state.

Then if a short circuit occurs in the turn-on phase of MOSFET output stages 1 and 2, a short circuit of MOSFET output stage 1 is detected in the following cutoff operation, and a short circuit of MOSFET output stage 2 is detected in the next turn-on phase, so that no further activation is possible after the instantaneous turn-on phase.

In an expansion of the circuit configuration described above, the monitoring logic for first MOSFET output stage 1 is supplemented so that it is possible to detect even a short circuit of MOSFET output stage 1 with simultaneous damage to respective logic circuit 3, so the input voltage would also be at high potential, so that downstream MOSFET output stage 2 would be turned on and thus load 6 would be activated.

Figure 2:
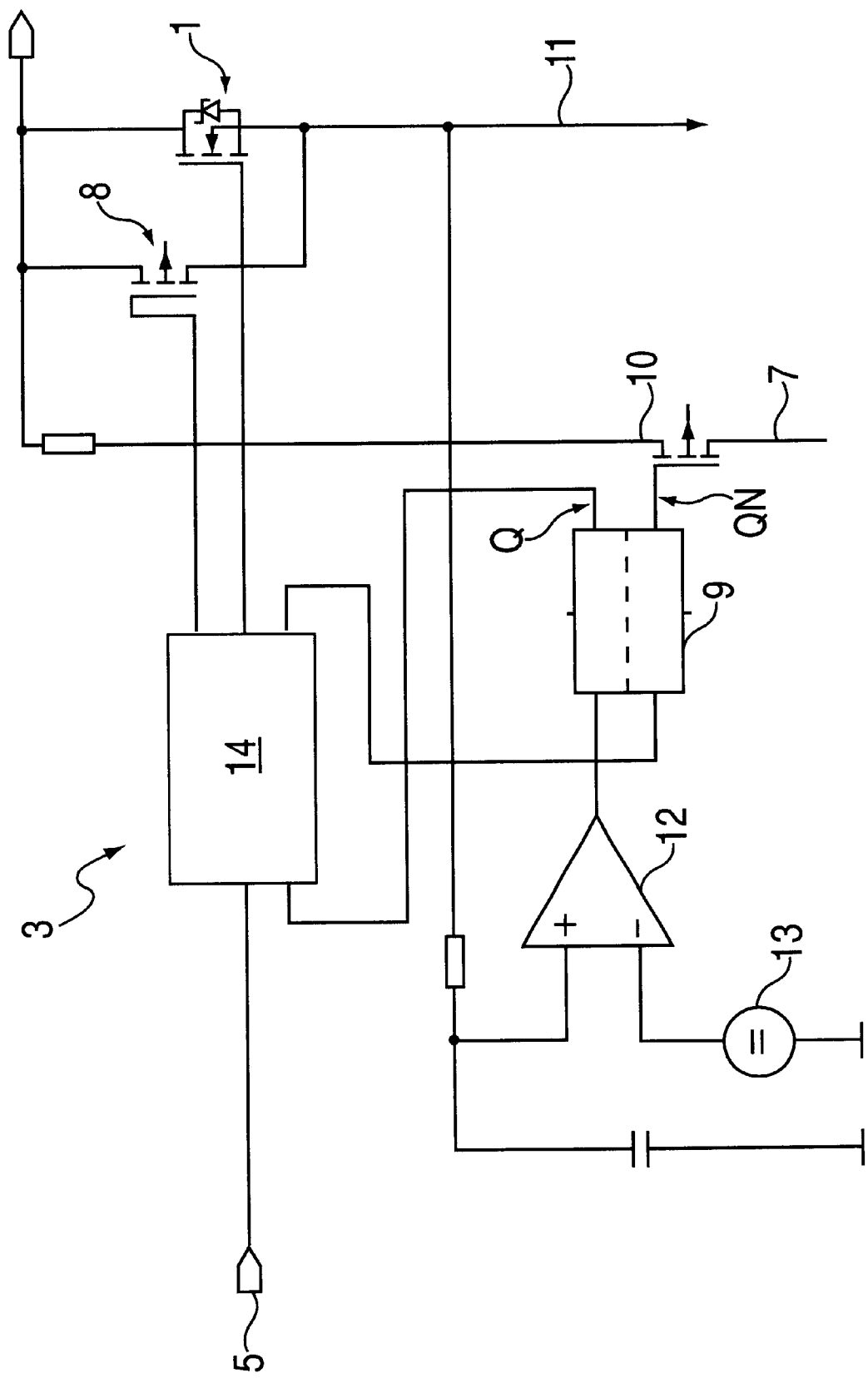
Figure 3:
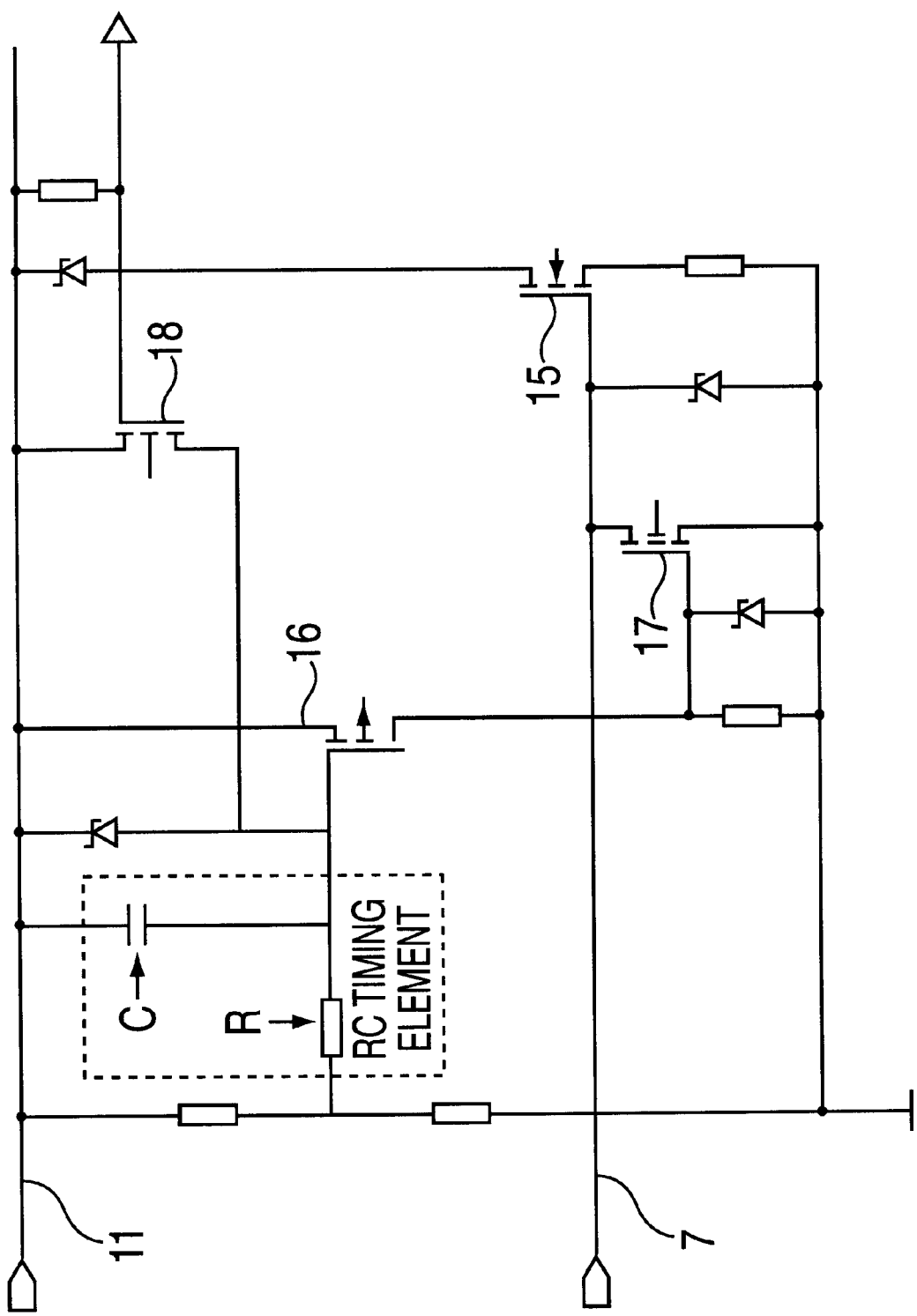
Figure 4:
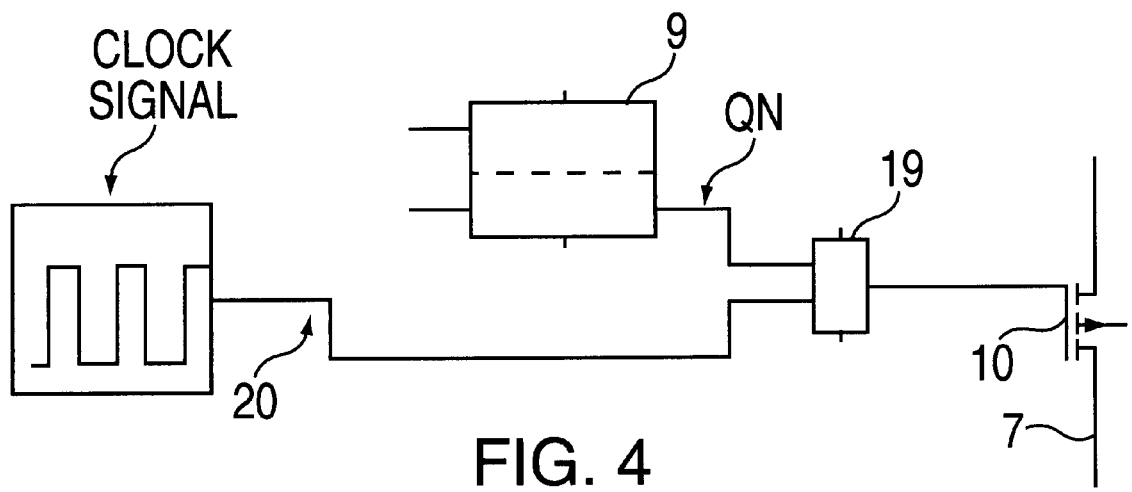

To also cover this fault case, the circuit parts shown in FIGS. 2 and 3 are expanded as follows. An OR gate 19 whose second input is controlled with a clock signal 20, as illustrated in FIG. 4, is inserted between output QN of flip-flop 9 and downstream transistor 10. Thus, input voltage EN for system logic 4 of downstream MOSFET output stage 2 is clocked.

Figure 5:
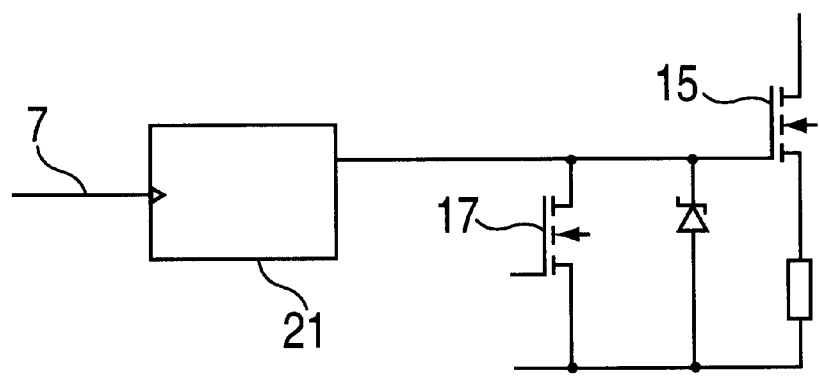

An edge-triggered monoflop 21 is controlled with this clocked input voltage EN, as shown in FIG. 5. The ON time of monoflop 21 is matched to the clock frequency of clocked input voltage 20.

If there is damage to system logic 3 of first MOSFET output stage 1, so that the input voltage is always at high potential, then no switching edges can be detected in the signal of input voltage EN. In this case, load 6 is also switched off after the monoflop time constant has elapsed.

In summary, it should be pointed out here again that the circuit configuration according to an exemplary embodiment of the present invention implements mutual monitoring for short circuit of the two series-connected MOSFET output stages. Monitoring of the downstream MOSFET output stage is based on the principle of load monitoring, where a high-resistance load corresponds to the normal state, while a low-resistance load signals a short circuit in the downstream MOSFET output stage. Monitoring of the first MOSFET output stage is based on a comparison between the input voltage and the power supply voltage of the downstream MOSFET output stage.

What is claimed is:

1. A circuit configuration for switching a load, based on a starting signal, comprising:
   a plurality of logic circuits;
   a first MOSFET output stage controlled by one of the logic circuits;
   a second downstream MOSFET output stage;
   an input line connected to the one of the logic circuits, wherein an input voltage is applied over the input line to the one of the input logic circuits, the second downstream MOSFET output stage connected in series with the first MOSFET output stage and controlled by another one of the logic circuits, a power supply voltage of the second downstream MOSFET output stage being supplied over the first MOSFET output stage;
   a connecting line provided between the logic circuits, the load being connected downstream from the first MOSFET output stage and from the second downstream MOSFET output stage;
   an arrangement for monitoring the power supply voltage of the second downstream MOSFET output stage and for preventing an activation of the first MOSFET output stage when the power supply voltage is below a predetermined value, the arrangement for monitoring being activated by the starting signal;

a second line connecting the first MOSFET output stage and the second downstream MOSFET output stage;

an arrangement for varying the input voltage when the first MOSFET output stage is activated based on the starting signal; and an arrangement for activating the second downstream MOSFET output stage, wherein the arrangement for activating includes an arrangement for preventing an activation of the second downstream MOSFET output stage when the power supply voltage exceeds a threshold potential before an arrival of the starting signal is detected, the arrangement for preventing the activation of the second downstream MOSFET output stage being connected to the connecting line and to the second line.

2. The circuit configuration of claim 1, wherein:

the one of the logic circuits controlling the first MOSFET output stage includes an arrangement for clocking the input voltage, and the other one of the logic circuits controlling the second downstream MOSFET output stage includes an arrangement for monitoring the input voltage and for preventing the activation of the second downstream MOSFET output stage when a switching edge in the input voltage is not detected.

3. The circuit configuration of claim 2, wherein the arrangement for monitoring the power supply voltage includes:

a first transistor connected in parallel to the first MOSFET output stage and activated by the starting signal while the first MOSFET output stage remains off, an operational amplifier including inputs at which the power supply voltage and a reference voltage are applied, and a flip-flop disposed downstream from the operational amplifier and for activating the first MOSFET output stage when the power supply voltage is above the reference voltage.

4. The circuit configuration of claim 3, wherein:

the flip-flop varies the input voltage when the flip-flop activates the first MOSFET output stage.

5. The circuit configuration of claim 3, further comprising:

a second transistor activating the second downstream MOSFET output stage, the second transistor being switched between the power supply voltage and the input voltage so that the second downstream MOSFET output stage is activated when the input voltage and the power supply voltage exceed the threshold potential.

6. The circuit configuration of claim 5, further comprising:

a third transistor controlling via the second transistor the second downstream MOSFET output stage and preventing the activation of the second downstream MOSFET output stage when the power supply voltage exceeds the threshold potential and the input voltage is below the threshold potential.

7. The circuit configuration of claim 6, further comprising:

an arrangement for preventing a simultaneous activation of the second transistor and the third transistor.

8. The circuit arrangement of claim 3, wherein:

the arrangement for clocking includes an OR date disposed downstream from the flip-flop, an input of the OR gate is controllable by a clock signal, and the arrangement for monitoring the input voltage includes an edge-triggered mono-flop exhibiting an ON time that is matched to a clock frequency of a clocking signal.

9. The circuit arrangement of claim 1, wherein:

the apparatus is used to switch safety-relevant loads in a motor vehicle.

10. The circuit arrangement of claim 1, wherein:

the predetermined value corresponds to a short circuit of the second downstream MOSFET output stage.

* * * * *

UNITED STATES PATENT AND TRADEMARK OFFICE
CERTIFICATE OF CORRECTION

PATENT NO.   : 6,320,405 B1  
DATED        : November 20, 2001  
INVENTOR(S)  : Koelsch, V. et al.

It is certified that error appears in the above-identified patent and that said Letters Patent is hereby corrected as shown below:

Column 1,  
Line 8, change "OF THE INVENTION" to -- INFORMATION --  
Lines 65 and 66, delete "In an advantageous embodiment of the circuit configuration."  
Line 67, insert between the words "into" and "case" -- account a short circuit in the first MOSFET output stage, the --

Column 2,  
Line 14, insert between the words "to" and "the" -- an advantageous embodiment of --  
Line 15, change "Especially advantageous" to -- Exemplary --  
Lines 17 and 18, delete "The drawings show"  
Lines 24 and 26, change "an" to -- shows an -- and change "the circuit part" to -- a circuit arrangement --  
Line 28, change "an" to -- shows an -- and change "part" to -- arrangement --  
Line 29, change "system logic" to -- logic circuit or system --  
Line 31, change "a" to -- shows a -- and change "part" to -- arrangement --

Column 3,  
Lines 55, 59 and 66, delete "s"

Signed and Sealed this

Third Day of December, 2002

JAMES E. ROGAN  
*Director of the United States Patent and Trademark Office*